(12) United States Patent
Carpenter et al.

(10) Patent No.: US 10,734,312 B2
(45) Date of Patent: *Aug. 4, 2020

(54) PACKAGED INTEGRATED CIRCUIT HAVING STACKED DIE AND METHOD FOR THEREFOR

(71) Applicant: NXP USA, INC., Austin, TX (US)

(72) Inventors: Burton Jesse Carpenter, Austin, TX (US); Kim Roger Gauen, Noblesville, IN (US)

(73) Assignee: NXP USA, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/038,684

(22) Filed: Jul. 18, 2018

(65) Prior Publication Data

US 2020/0027823 A1 Jan. 23, 2020

(51) Int. Cl.
| | |
|---|---|
| *H01L 23/495* | (2006.01) |
| *H01L 23/00* | (2006.01) |
| *H01L 23/62* | (2006.01) |
| *H01L 21/56* | (2006.01) |
| *H01L 25/065* | (2006.01) |
| *H01L 23/522* | (2006.01) |
| *H04B 5/00* | (2006.01) |
| *H01L 23/31* | (2006.01) |

(52) U.S. Cl.
CPC ........ *H01L 23/49575* (2013.01); *H01L 21/56* (2013.01); *H01L 23/3128* (2013.01); *H01L 23/4952* (2013.01); *H01L 23/5227* (2013.01); *H01L 23/62* (2013.01); *H01L 24/33* (2013.01); *H01L 24/49* (2013.01); *H01L 24/83* (2013.01); *H01L 24/85* (2013.01); *H01L 25/0652* (2013.01); *H04B 5/005* (2013.01)

(58) Field of Classification Search
CPC .......... H01L 23/49575; H01L 25/0657; H01L 2225/0651; H01L 23/49541; H01L 2224/48137; H01L 23/495; H04L 25/0266; H04B 5/005–5/0075; H02J 5/005
See application file for complete search history.

(56) References Cited

U.S. PATENT DOCUMENTS

| | | |
|---|---|---|
| 7,892,858 B2 | 2/2011 | Liu et al. |
| 7,932,590 B2 | 4/2011 | Lam |
| (Continued) | | |

OTHER PUBLICATIONS

Infineon EiceDRIVER™ 2ED020I12-F2 Dual IGBT Driver IC Final Data Sheet Rev. 2.0, Jun. 5, 2012; Industrial Power Control.
(Continued)

*Primary Examiner* — Alia Sabur

(57) ABSTRACT

A packaged integrated circuit (IC) device includes a first set of stacked die having a first IC die, a first inductor in the first IC die, an isolation layer over the first IC die, a second IC die over the isolation layer, and a second inductor in the second IC die aligned to communicate with the first inductor, and a second set of stacked die having a third IC die, a third inductor in the third IC die, a second isolation layer over the third IC die, a fourth IC die over the second isolation layer, and a fourth inductor in the fourth IC die aligned to communicate with the third inductor. The isolation layer extends a prespecified distance beyond a first edge of the second IC die, and the second isolation layer extends a second prespecified distance beyond a first edge of the fourth IC die.

20 Claims, 8 Drawing Sheets

(56) References Cited

U.S. PATENT DOCUMENTS

| | | |
|---|---|---|
| 8,258,599 B2 | 9/2012 | Lam |
| 8,364,195 B2 | 1/2013 | Spina et al. |
| 9,035,422 B2 | 5/2015 | Khanolkar et al. |
| 9,111,772 B1 | 8/2015 | Strutz et al. |
| 9,219,028 B1 | 12/2015 | Higgins et al. |
| 9,269,694 B2 | 2/2016 | Chen et al. |
| 10,062,665 B2 | 8/2018 | Chen et al. |
| 2006/0040177 A1 | 2/2006 | Onodera et al. |
| 2007/0138572 A1 | 6/2007 | Lam |
| 2007/0138628 A1 | 6/2007 | Lam |
| 2009/0243782 A1 | 10/2009 | Fouquet et al. |
| 2013/0154081 A1 | 6/2013 | Kadoguchi et al. |
| 2013/0154084 A1 | 6/2013 | Kadoguchi et al. |
| 2015/0001948 A1* | 1/2015 | Brauchler ............... H01F 19/08 307/104 |
| 2015/0162307 A1 | 6/2015 | Chen et al. |
| 2015/0200162 A1* | 7/2015 | Constantino ............ H01L 23/66 257/532 |
| 2016/0282388 A1* | 9/2016 | Milano .................... H01L 43/02 |
| 2017/0162542 A1 | 6/2017 | Chen et al. |
| 2018/0061745 A1* | 3/2018 | Otremba ............ H01L 23/49575 |
| 2018/0277518 A1* | 9/2018 | Iida ..................... H01L 21/0214 |

OTHER PUBLICATIONS

Photograph and X-rays of Infineon IC 2ED020I12-F2 taken prior to Jul. 2018.

U.S. Appl. No. 15/925,022; Higgins, Leo M. III, et al.; "Packaged Integrated Circuit Having Stacked Die and Method for Therefor;" filed Mar. 19, 2018.

Avago Technologies, "Avago Regulatory Guide to Isolation Circuits" White Paper AV02-2041EN, www.avagotech.com, Published: Sep. 15, 2011.

Avago Technologies, "Stacked LED Technology Enables Highly Integrated Optocouplers," White Paper AV02-2402EN, www.avagotech.com, Published: Mar. 20, 2010; Downloaded from Internet on Dec. 13, 2017.

Uchida, Shinichi, et al., "A Face-to-Face Chip Stacking 7kV RMS Digital Isolator for Automotive and Industrial Motor Drive Applications," (pp. 442-445), Proceedings of the 26th International Symposium on Power Semiconductor Devices & IC's, Jun. 15-19, 2014, Waikoloa, Hawaii, DOI: 10.1109/ISPSD.2014.6856071.

\* cited by examiner

PACKAGED INTEGRATED CIRCUIT HAVING STACKED DIE AND METHOD FOR THEREFOR

BACKGROUND

Field

This disclosure relates generally to integrated circuit packaging, and more specifically, to a packed integrated circuit having stacked die.

RELATED ART

Communication between integrated circuit (IC) die can be achieved using inductive coupling in which two die can use transmitting and receiving inductors to communicate. In such applications, electrical (or galvanic) isolation is desired between the die. "Galvanic isolation" means that there is no metallic or DC electrically conductive path between the distinct circuits. For example, galvanic isolation may be desired to protect a first IC die that operates at a relatively low supply voltage from a second IC die that operates at a relatively high supply voltage difference from the first IC die.

In order for the communication to be effective, the die must be in close proximity. However, the closer in proximity the die are, the higher the electrical fields between the die and hence the greater chance of destructive arcing. Therefore, the galvanic isolation should be sufficient to prevent destruction of the isolation between the die and to maintain sufficient high voltage isolation in order to meet safety standards. Furthermore, it may be necessary to package a higher number of die, greater than just 2, in single package while still providing for galvanic isolation. It may also be necessary to isolate multiple high voltage domains from each other as well as between the high and low voltage domains.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a package integrated circuit (IC) is formed having stacked IC die which are aligned such that an inductor in one of the stacked die may communicate with an inductor in another one of the stacked die. To provide galvanic isolation between the stacked die, a preformed isolation layer is used which extends beyond the edges of the top die. In an additional aspect, a conductive ring is formed on the isolation layer, surrounding the top die, which extends partially under the top die and extends from the edges of the top die onto the isolation layer. This ring has rounded corners and does not extend to the edges of the isolation layer. In another aspect, a packaged IC is formed having multiple sets of stacked IC die in which each set of stacked die includes aligned inductors and provides galvanic isolation with the preformed isolation layer. Any of the multiple sets of stacked die may further include a conductive ring formed on the isolation layer between two die of the stacked die to further improved galvanic isolation.

Figure 1:
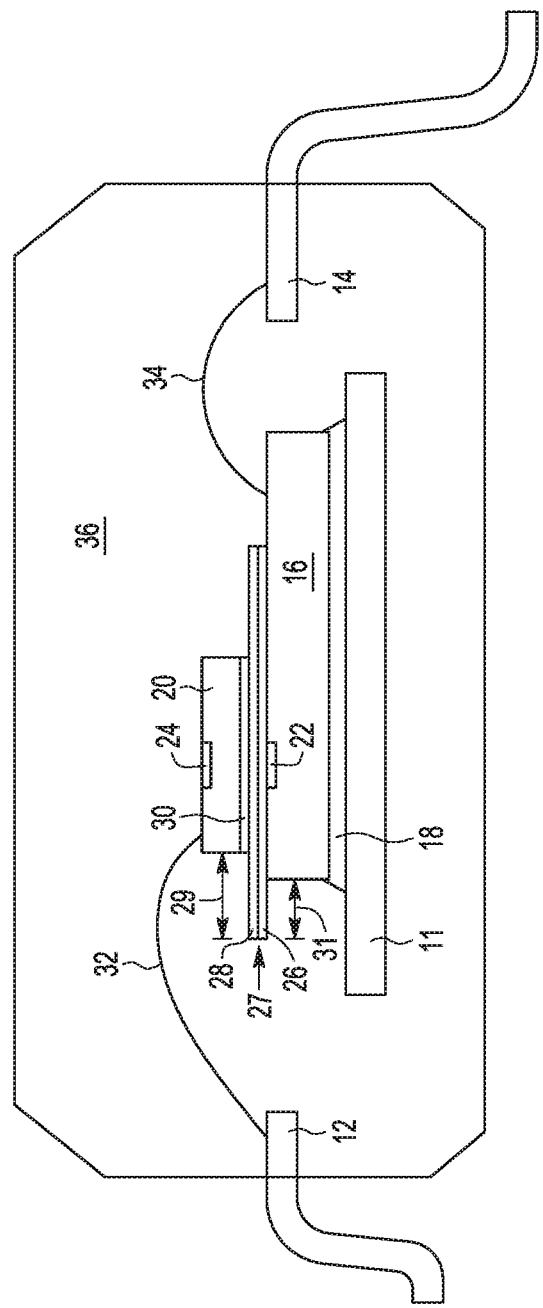
FIG. 1 illustrates a cross section of a packaged integrated circuit (IC) having stacked die in accordance with one embodiment of the present invention.

FIG. 1 illustrates a cross-section of packaged IC 10 having stacked IC die 16 and 20, in accordance with one embodiment of the present invention. When referring to the embodiment of FIG. 1, die 20 may be referred to as the top die and die 16 as the bottom die. Formation of packaged IC 10 will be described in more detail in reference to flow diagram 100 of FIG. 3.

Referring first to FIG. 1, package IC 10 includes die 16 attached to a lead frame flag portion 11 with an adhesive 18. Die 16 includes an inductor 22 formed therein. Die 16 may also include other circuitry, as needed, formed therein. Die 20 is stacked on die 16 with an isolation layer 28 (also referred to as an isolation barrier or barrier layer) located between die 20 and die 16. Die 20 includes an inductor 24 formed therein. Die 20 may also include other circuitry, as needed, formed therein. A bottom major surface of isolation layer 28 is attached to a top major surface of die 16 via an adhesive layer 26. Note that adhesive layer 26 may extend fully under isolation layer 28. A bottom major surface of die 20 is attached to a top major surface of isolation layer 28 via an adhesive layer 30. The lead frame also includes lead frame leads 12 and 14. A wire bond 32 is connected between a top major surface of die 20 and lead 12, and a wire bond 34 is connected between the top major surface of die 16 and lead 14. An encapsulant 36 completely surrounds the stacked die 16 and 20, and wire bonds 32 and 34.

Note that any number of leads may be present in the lead frame and any number of wire bonds connected the leads to die 16 or 20, but they are not visible in the cross section of FIG. 1. Also, each of inductors 22 and 24 is illustrated as being on the "active" side of each die, but each may be located at either surface of the die, or buried within the die.

Figure 2:
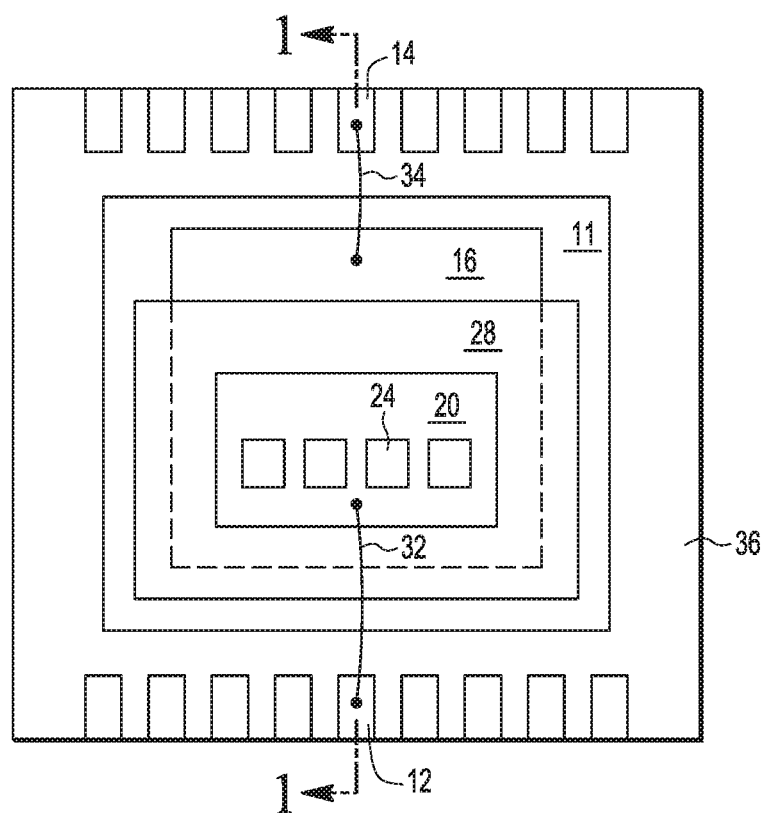
FIG. 2 illustrates a top down view of the packaged IC of FIG. 1, in accordance with one embodiment of the present invention.

FIG. 2 illustrates a top down view of packaged IC 10 of FIG. 1. Note that each die may include any number of inductors. In the illustration of FIG. 2, die 20 includes four inductors, one of which is inductor 24. Die 16 may also include any number of inductors, but they are not visible in the view of FIG. 2. In one embodiment, die 20 is coupled to receive low voltage signals from leads and die 16 is coupled to receive high voltage signals from leads, in which the high voltage is higher than the low voltage. In one embodiment, the low voltage connections are made via wire bonds to the leads on the top half of the lead frame, and the high voltage connections are made via wire bonds to leads on the bottom half of the lead frame. Also note that each lead frame lead can have more than one wire bond connection. Note that the shape and orientation of the leads of the lead frame and the shape and form of the flag portion of the lead frame may vary, as FIG. 2 illustrates a simplified lead frame.

As can be seen in FIGS. 1 and 2, isolation layer 28 extends a prespecified distance beyond the edges (or minor surfaces) of die 20. In one embodiment, this prespecified distance ensures that dielectric breakdown does not occur in encapsulant 36. For example, this distance may be 500 micrometers. In one embodiment, the prespecified distance is the same as measured from all four edges, or they can be varying or different on each side of die 20. In the illustrated embodiment, isolation layer 28 also extends beyond some of the edges (or minor surfaces) of die 16. Referring to FIG. 1, a creepage distance is defined with respect to an overhang 27 of isolation layer 28 which extends beyond the edge of die 16. This creepage distance is distance 29, in addition to the thickness of combined layers 28 and 26, and in addition to distance 31. Therefore, the creepage distance represents the wrap around distance from the edge of die 20 out around overhang 27 of isolation layer 28 and back to the edge of 16. In one embodiment, the overhang of isolation layer 28 is such that the creepage distance is at least 100 micrometers, or preferably, 500 micrometers or more.

Referring back to FIG. 1, die 16 and die 20 are aligned such that inductor 24 may communicate with inductor 22. Therefore, each of inductor 14 and inductor 22 may be a transmitting or receiving inductor. In order to allow effective communication, inductor 24 should be in close proximity to inductor 22. Therefore, the thickness of intervening layers 26, 28, and 30, between die 16 and 20, should be minimized as well as tightly controlled. However, isolation layer 28 should have a thickness which provides galvanic isolation and protects against breakdown of isolation layer 28. That is, while the inductors communicate, isolation layer 28 provides AC and DC electrical isolation. Isolation layer 28 may include a dielectric, epoxy, bismaleimide triazine (BT), FR-4, polyimide, or a resin and may have a thickness in a range of 40-200 micrometers.

Figure 3:
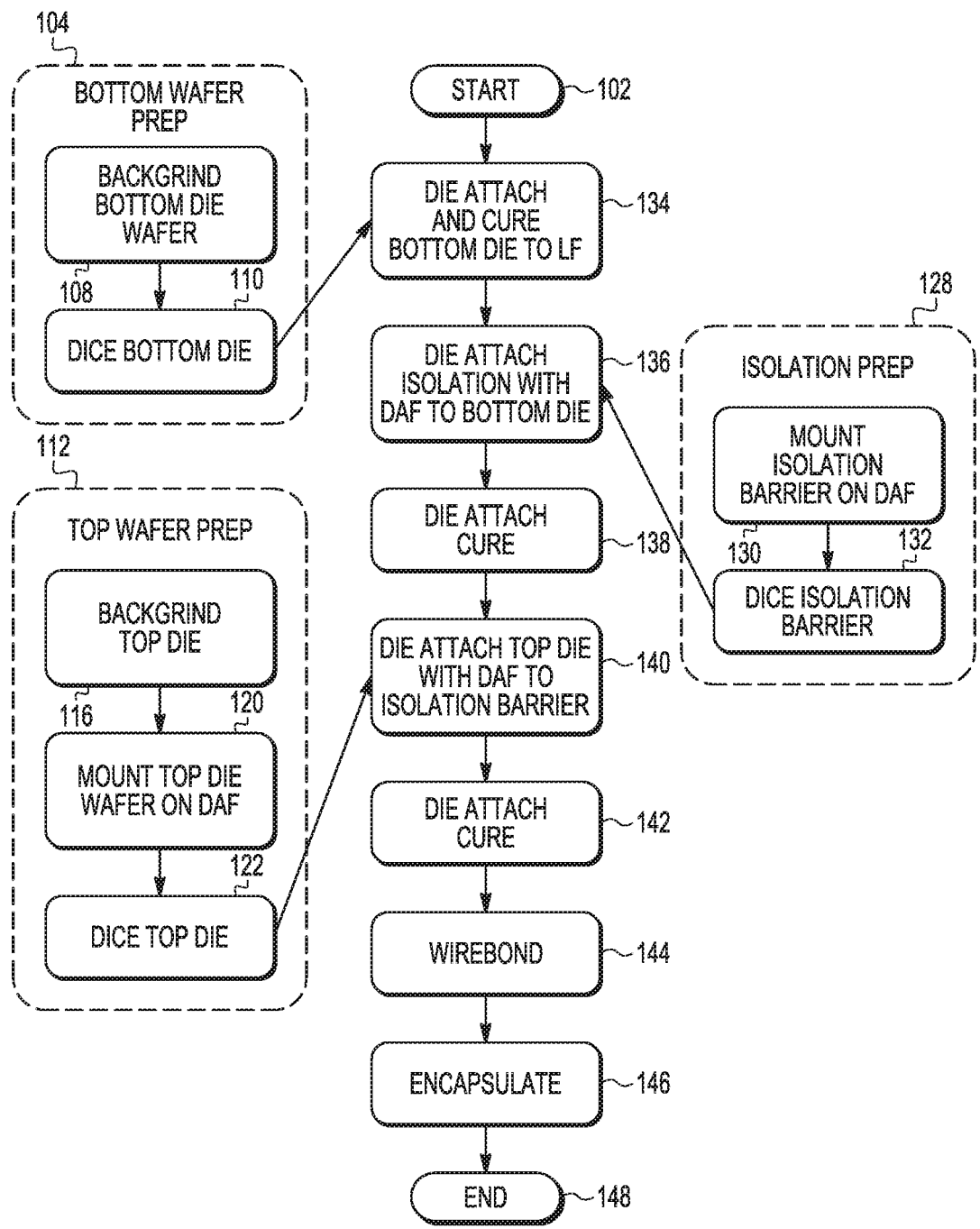
FIG. 3 illustrates, in flow diagram form, a method for forming a packaged IC with stacked die, in accordance with one embodiment of the present invention.

Further details of packaged IC 10 are provided in reference to the formation of packaged IC 10 illustrated in method 100 of FIG. 3. In block 104, the bottom die wafer (containing the bottom die) is prepared by backgrinding the bottom die wafer to a desired thickness in block 108 and dicing the bottom die wafer to singulate the die in block 110. Method 100 begins at start 102 and proceeds to block 134 in which die 16 (the bottom die) is attached to lead frame flag portion 11 using an epoxy die attach material for adhesive 18. After attaching die 16 to flag portion 11, the assembly is cured.

In block 128, an isolation layer is prepared by mounting the isolation layer onto a die attach film (DAF) in block 130 and then dicing the isolation layer mounted onto the DAF in block 132, to result in a pre-formed isolation layer. That is, the isolation layer is fully formed prior to attachment to die 16. Returning to method 100, after block 134, method 100 proceeds to block 136 in which the pre-formed isolation layer with the DAF is attached to die 16. In this embodiment, the pre-formed isolation layer is isolation layer 28 and the DAF is adhesive layer 26. Since the isolation layer is pre-formed and mounted on the DAF, the combined thickness of isolation layer 28 and adhesive layer 26 can be uniform and tightly controlled. If a gel or paste adhesive were used rather than a DAF for adhesive layer 26, the resulting thickness would be less controlled. Afterwards, the assembly of die 16 with isolation layer 28 and adhesive layer 26 is cured in block 138.

In block 112, the top die wafer (containing the top die) is prepared by backgrinding the top die wafer to a desired thickness in block 116, mounting the top die wafer to a DAF in block 120, and dicing the top die wafer with the DAF to singulate the top die in block 122. Method 100 continues after block 138 to block 140 in which the singulated top die mounted on the DAF is attached to isolation layer 28. Therefore, in this embodiment, the singulated top die is die 20 and adhesive layer 30 is the DAF that die 20 is mounted on. Similar to the DAF used for isolation layer 28, the use of a DAF for attaching die 20 to isolation layer 28 allows for the resulting thickness of layers between die 16 and die 20 to be uniform and tightly controlled. In alternate embodiments, other adhesive layers may be used which allow for a controlled thickness. Again, if a gel or paste adhesive were used, the resulting thickness may be less controlled. Note that depending on the type of adhesive used for adhesive layer 30, adhesive layer 30 may extend to the edge of isolation layer 28, or beyond. In one embodiment, a combined thickness of isolation layer 28, adhesive layer 26, and adhesive layer 30 is between 50 and 500 micrometers, or preferably, in between 50 and 200 micrometers, or preferably, between 90 and 110 micrometers.

After block 140, method 100 proceeds with block 142 in which the assembly having die 16, isolation layer 28, and die 20 is cured to cure adhesive layer 30. In an alternate embodiment, the cure of block 138 may not be performed, in which case, only the cure in block 142 would be performed to cure adhesive layers 26 and 30. After block 142, method 100 proceeds to block 144 in which wire bond connections are formed from the lead frame leads to die 16 and die 20, such as wire bonds 34 and 32. Method 100 continues with block 146 in which die 16, isolation layer 28, die 20, and the wire bonds are encapsulated with encapsulant 36. Any known techniques may be used to form the wire bonds and to encapsulate the die. Additional steps may be performed, such as trimming and forming of leads, to result in a substantially completed packaged IC 10. Method 100 ends at end 148.

Note that the off-line preparation blocks, such as blocks 104, 128, and 112, can be performed before beginning method 100. Also, they can be performed in any order. Also, note that although two die are illustrated, any number of die and pre-formed isolation layers may be used, as needed. Furthermore, the pre-formed isolation layer may have various different sizes and shapes. Although the illustrated embodiment is in reference to a lead frame based package, other packages may be used which also include stacked die with intervening pre-formed isolation layers such as layer 28. For example, an isolation layer such as isolation layer 28 may be used for ball grid array (BGA) packages with organic or inorganic substrates.

Figure 4:
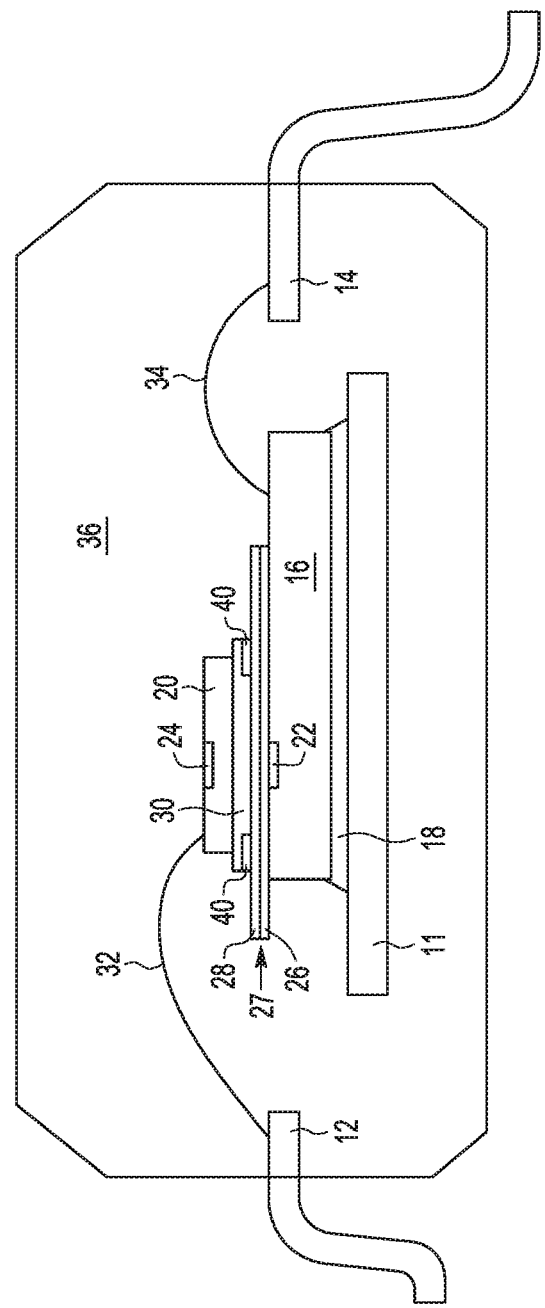
FIG. 4 illustrates a cross section of a packaged IC having stacked die in accordance with one embodiment of the present invention.
Figure 5:
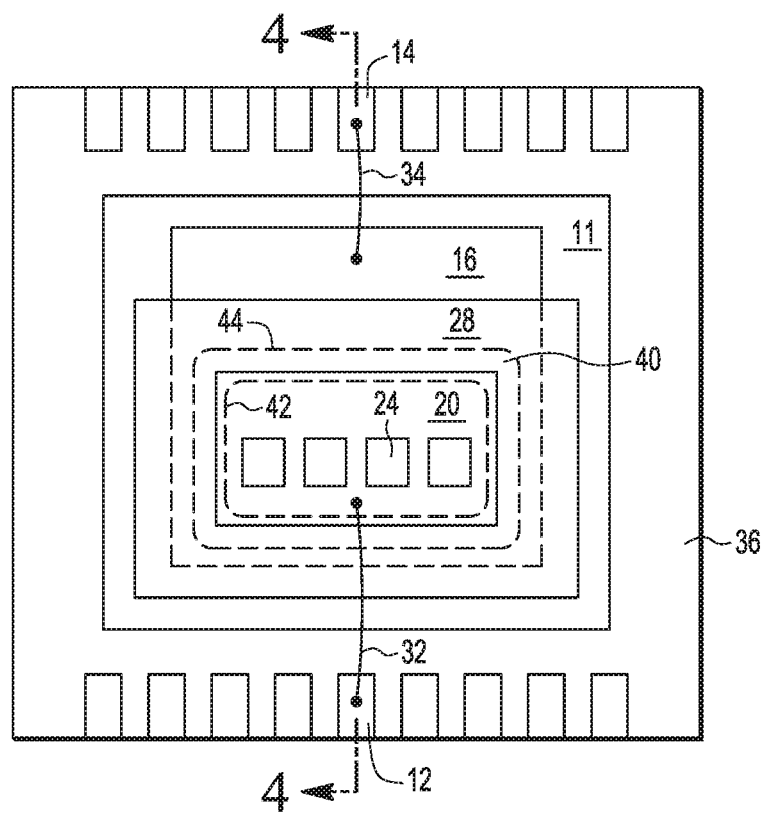
FIG. 5 illustrates a top down view of the packaged IC of FIG. 4, in accordance with one embodiment of the present invention.

FIG. 4 illustrates a cross section view of a packaged IC 50 which is similar to packaged IC 10, in which like numerals indicate like elements. However, packaged IC 50 includes a conductive ring 40 over isolation layer 28, such that it is located between adhesive layer 30 and isolation layer 28. FIG. 5 illustrates a top down view of packaged IC 50 of FIG. 4, similar to the top down view of FIG. 2, in which like numerals indicate like references, but with ring 40. As can be seen in FIG. 5, conductive ring 40 surrounds top die 20, and has an inner perimeter 42 and an outer perimeter 44. Inner perimeter 42 is located under die 20 (that is, inner perimeter 42 of ring 40 extends under die 20) and is located away from the inductors of die 20. Outer perimeter 44 of ring 40 extends a predetermined distance beyond the edges (or minor surfaces, perpendicular to adhesive 30) of die 20. In one embodiment, this predetermined distance is 100 micrometers. Conductive ring 40 may be metal, such as copper. Note that the presence of ring 40 affects the creepage distance. Rather than starting with distance 29 as seen in FIG. 1, the creepage distance is the distance from outer perimeter 44 of ring 40 to the edge of isolation layer 28, in addition to the total thickness of layers 28 and 26, and in addition to the distance back to die 16. That is, the creepage distance in the embodiment of FIGS. 4 and 5 begins at the outer edge of ring 40, rather than the outer edge of die 20, and wraps around overhang 27 of isolation layer 28 and back to the edge of die 16.

As illustrated in FIG. 5, both the inner and outer perimeters of ring 40 are rounded. This rounding of the corners of both perimeters avoids sharp shapes or corners. The size of conductive ring 40 is sufficiently big to make sure all the corners of die 20 are well within conductive ring 40. Since the electric field strength around die corners formed as a result of the dicing process is much higher than in flat areas, the insulation material (of isolation layer 28) is prone to breakdown at these corners. Therefore, having a continuous conductive ring, such as ring 40, with rounded corners reduces the electric field strength at the die corners and thus reduces the risk of a corona effect which can result in destruction of the isolation layer. In one embodiment, only the corners of the outer perimeter of ring 40 is rounded and not the corners of the inner perimeter. That is, rounding the corners of the inner perimeter may not be necessary as they do not have the high fields that the corners of the outer perimeter have. Therefore, while the corners of the inner perimeter can be rounded, the majority of the value is achieved by rounding the corners of the outer perimeter.

Referring back to method 100 of FIG. 3, to include conductive ring 40, the only change is in the preparation of the pre-formed isolation layer in block 128. In one embodiment, the insulating layer which is mounted to the DAF in block 130 comes as a core insulating material with copper clad on both sides. Therefore, for the embodiment of FIGS. 1 and 2, all of the copper, from both sides, can be etched off or removed. In the embodiment of FIGS. 4 and 5, the copper may be removed from the bottom major surface and patterned and etched on the top major surface to result in a copper ring. The bottom major surface of the insulating layer can then be mounted to the DAF and diced, such that pre-formed insulating layers are formed having a copper ring formed on the top major surface and a DAF on the bottom major surface. Therefore, this pre-formed insulating layer can be attached in block 136, such that when the pre-formed isolation layer is attached to die 16 it will have conductive ring 40 as well as adhesive layer 30.

Figure 6:
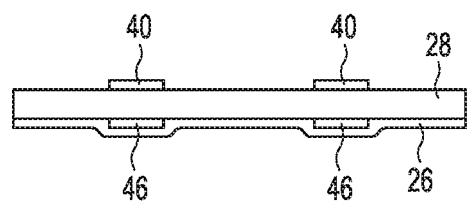
FIG. 6 illustrates a cross section of a portion of the packaged IC of FIG. 4, in accordance with an alternate embodiment of the present invention.

FIG. 6 illustrates an alternate embodiment of the pre-formed insulating layer of FIGS. 4 and 5 in which, rather than removing all the copper from the bottom major surface of the insulating layer, the bottom major surface is patterned and etched so as to result in a second conductive ring 46 on a bottom surface of the insulting layer. The insulating layer, with ring 40 on the top major surface and ring 46 on the bottom major surface is then mounted to the DAF. In this embodiment, ring 46 is between the bottom major surface of the insulating layer and the DAF. Therefore, if this pre-formed insulating layer were used in the embodiment of FIGS. 4 and 5, ring 46 would be located between insulating layer 28 and adhesive layer 26. Ring 46 may also have inner and outer perimeters, which would also include rounded corners. With ring 46, the creepage distance would be measured from the edge of ring 40, out around overhang 27 of insulating layer 28, and back to the edge of ring 46. Note that in alternate embodiments, rings 40 and 46 may have different dimensions.

In one embodiment, a thickness of each of adhesive layer 26 and adhesive layer 30 is between 50 and 200 micrometers, or between 90 and 110 micrometers. In one embodiment, the overhang of isolation layer 28 and the width of conductive ring 40, if present, results in a creepage distance of at least 100 micrometers. In one embodiment, a minimum distance between an edge of die 20 and outer perimeter 44 of conductive ring 40 is 500 micrometers.

Figure 7:
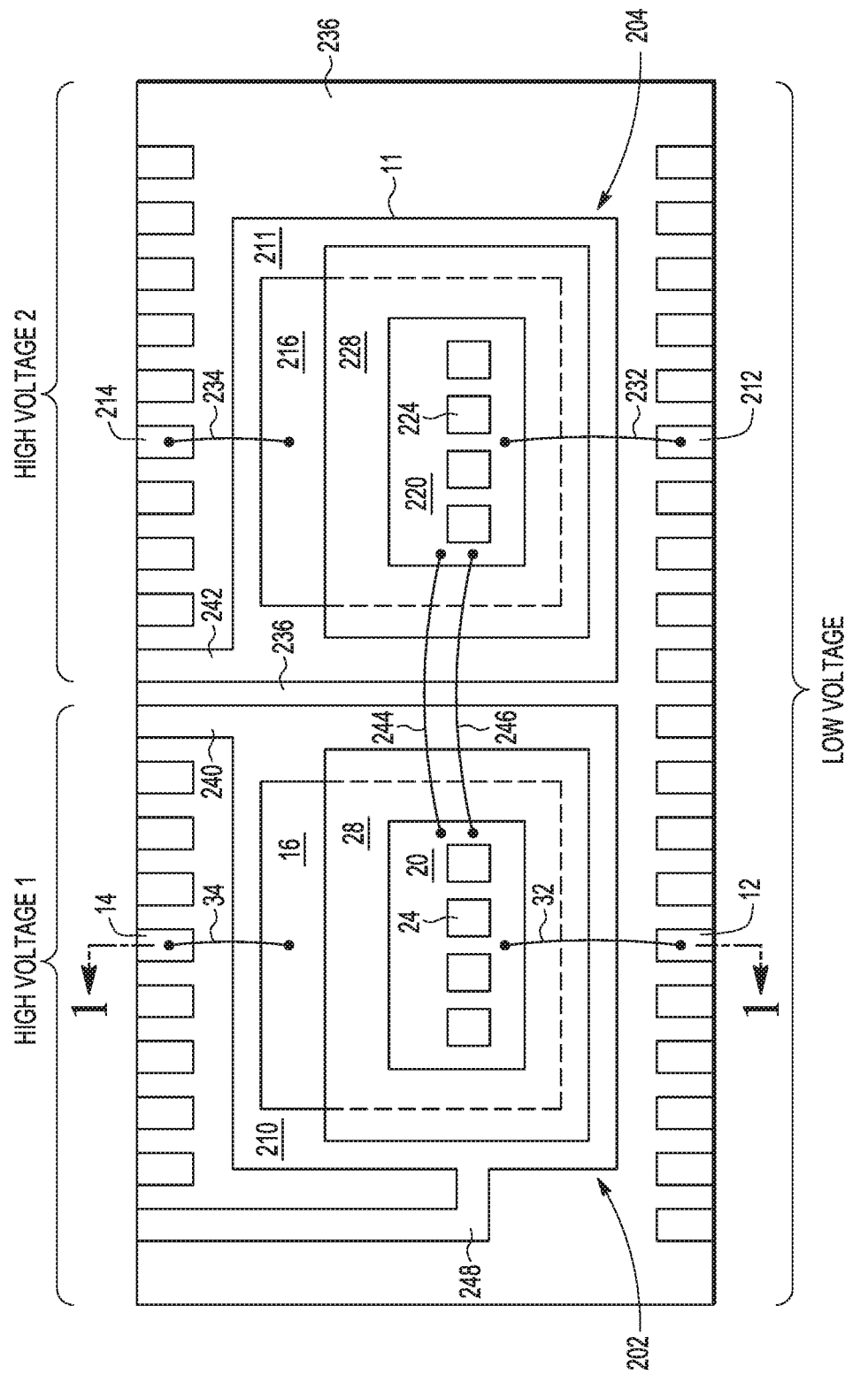
FIG. 7 illustrates a top down view of a packaged IC having multiple sets of stacked die, in accordance with one embodiment of the present invention.

Die 16, isolation layer 28, and die 20 may be referred to as a first set of stacked die 202. Note that set 202 may or may not include conductive ring 40 and may or may not include conductive ring 46. FIG. 7 illustrates a top down view of a singulated packaged IC 200 having multiple sets of stacked die, including the first set of stacked die 202 and a second set of stacked die 204, in accordance with one embodiment of the present invention. Therefore, packaged IC 200, as compared to packaged IC 10, includes multiple sets of stacked die. Packaged IC 200 includes a lead frame having leads 12, 14, 212, and 214 and having a flag portion including multiple flag sections, flag section 210 and flag section 211. Set 202 is attached to flag section 210, and set 204 is attached to flag section 211. Set 204 includes a die 216 (also referred to as a bottom die), a die 220 (also referred to as a top die), and an isolation layer 228 (also referred to as an isolation barrier or barrier layer) located between die 216 and 220. Die 220 also includes inductors 224 formed therein, but may also include circuitry therein as needed. Die 220 and 216 are aligned such that inductors 224 are aligned with one or more inductors in die 216. Packaged IC 200 includes a wire bond 232 connected between a top major surface of die 220 and lead 212, and a wire bond 234 is connected between the top major surface of die 216 and lead 214. Packaged IC 200 also includes an encapsulant 236 that completely surrounds set 202 and set 204 and wire bonds 32, 34, 232, and 234. Encapsulant 236 is also formed between flag sections 210 and 211.

Note that die 216, die 220, isolation layer 228, and inductors 224 are analogous to die 16, die 20, isolation layer 28, and inductors 24 described in FIGS. 1-6, and therefore, all the descriptions and details provided with respect to those elements apply to die 216, die 220, isolation layer 228, and inductors 224. Although die 216, die 220, isolation layer 228, and inductors 224 of set 204 are illustrated as having the same shapes and sizes as analogous elements in set 202, they need not be the same shape or size, and may include a different number of inductors. However, isolation layer 228 should extend a prespecified distance beyond the edges (or minor surfaces) of die 220 to ensure that dielectric breakdown does not occur in encapsulant 336. As discussed above, with respect to isolation layer 28, this distance may be 500 micrometers. The descriptions provided above with respect to the prespecified distance for isolation layer 28 also apply to isolation layer 228. Also, set 204 may also include adhesive layers analogous to adhesive layers 26 and 30, in which the discussion provided above with respect to these intervening layers also applies to set 204. Set 204 may also include a first conductive ring such as ring 40 or a second conductive ring such as ring 46, for both the first and second conductive rings.

Just as FIG. 1, in which a creepage distance is defined with respect to an overhang 27 of isolation layer 28 which extends beyond the edge of die 16, a creepage distance is defined with respect to an overhang of isolation layer 228 beyond the edge of die 216. Therefore, as in FIG. 1, in FIG. 7 the creepage distance within set 204 represents the wrap around distance from the edge of die 220 out around the overhang of isolation layer 228 and back to the edge of die 216, which includes the combined thicknesses of the adhesive layers. Note that sets 202 and 204, depending on the different sizing and shapes of the layers and elements within each set, may have different creepage distances, however, in one embodiment, the creepage distance of each set is at least 100 micrometers, or preferably, 500 micrometers or more.

Flag sections 210 and 211, unlike the illustrated embodiment of flag portion 11, include leads which directly extend from the flag section to the edge of packaged IC 200. For example, flag section 210 includes leads 240 and 248 which directly extends from flag section 210, and flag section 211 includes a lead 242 which directly extends from flag section 211. These leads allow for direct electrical connection, via the lead frame, to the corresponding flag section, and although only three are illustrated, each flag section may include one or more of these type of leads extending directly from the flag section. Note that any number of leads may be present in the lead frame and any number of wire bonds connecting the leads to die 16, 20, 216, and 220. The shape and orientation of the leads of the lead frame and the shape and form of the flag sections of the lead frame may vary, as FIG. 7 illustrates a simplified lead frame. Furthermore, packaged IC 200 includes wire bonds 244 and 246 which connect die 20 with 220. Note that any number of wire bonds may be present from either die with set 204 to either die with set 202. These wire bonds are also encapsulated with encapsulant 236.

In the illustrated embodiment of FIG. 7, the high voltage connections are made to the leads on the top half of the frame, which are coupled to the bottom die of each set of stacked die. These leads are referred to as high voltage (HV) leads. In one embodiment, the leads on the top half of the frame corresponding to flag section 210 correspond to a first high voltage domain, high voltage 1, and are coupled to bottom die 16, and the leads on the top half of the frame corresponding to flag section 211 correspond to a second high voltage domain, high voltage 2, and are coupled to bottom die 216. High voltage 1 and high voltage 2 may have different high voltage values. The low voltage connections are made to the leads on the bottom half of the frame, which are coupled to the top die of each set of stacked die. These leads are referred to as the low voltage (LV) leads. The use of separate flag sections, such as flag sections 210 and 211, allows adjacent HV leads to be better isolated from each other, especially in the case in which the flag sections correspond to two different HV domains, such as high voltage 1 and high voltage 2. Note that the low voltage die (top die 20 and 220) can be electrically connected to each other, such as by wire bonds 244 and 246. The HV die (bottom die 16 and 216) are isolated from each other and from the LV die. In this manner, the different high voltage domains with different high voltage values can be isolated from each other and from the LV die (which has lower voltage values as compared with the HV domains).

In the illustrated embodiment of FIG. 7, the lead frame of packaged IC 200 is rectangular in shape, but alternatively, may have a different aspect ratio and be shaped, for example, more like a square, depending on the needs and shapes of sets 202 and 204, or any other set located in packaged IC 200. That is, although two sets of stacked die are illustrated, packaged IC 200 may include more sets of similarly stacked die and may include any number of wire bonds, similar to wire bonds 244 and 246, among the multiple sets. Furthermore, if greater than two sets of stacked die are included in packaged IC 200, the bottom die of the sets can operate in two or more higher voltage domains.

Figure 8:
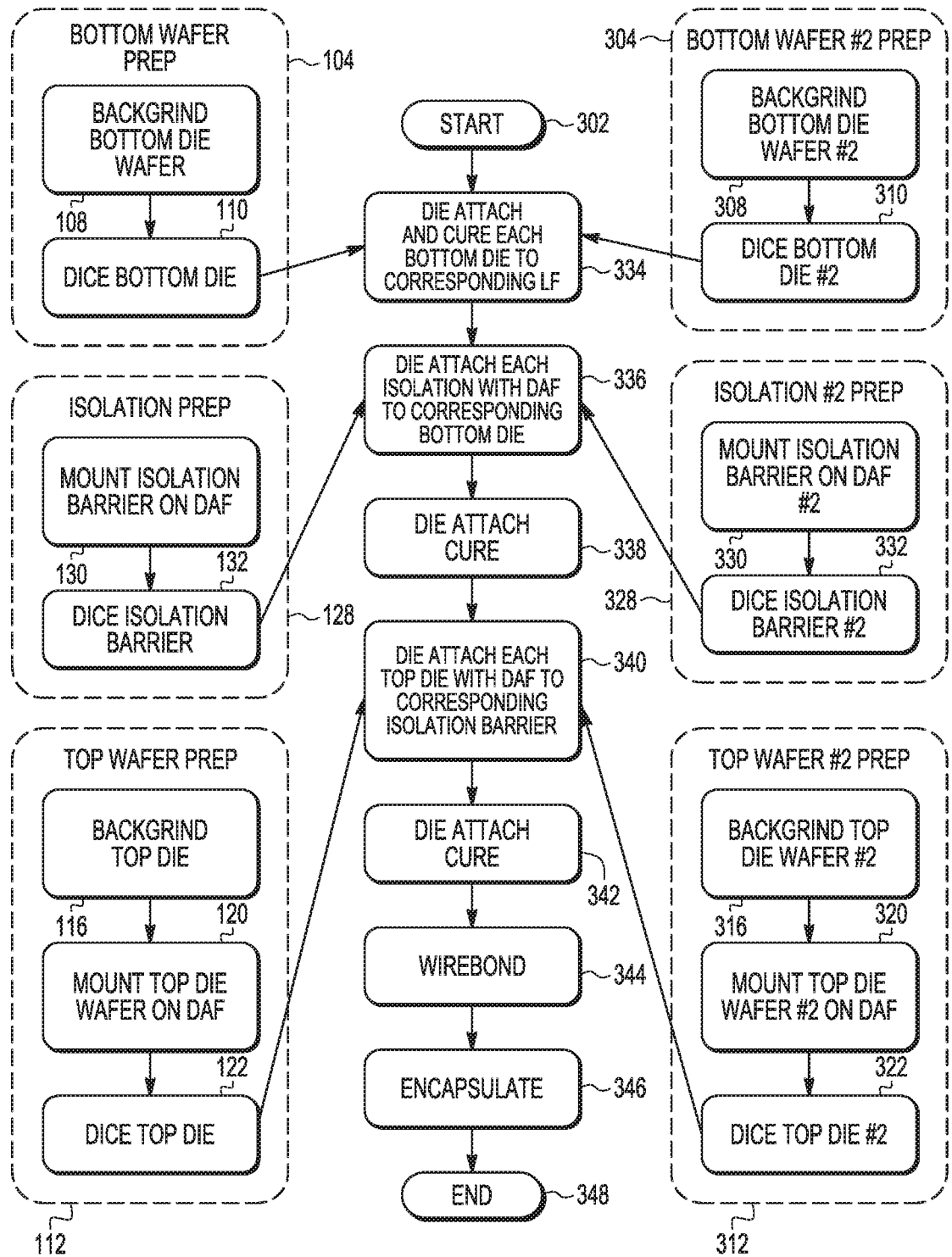
FIG. 8 illustrates, in flow diagram form, a method for forming a packaged IC having multiple sets of stacked die, in accordance with one embodiment of the present invention.

Further details of packaged IC 200 are provided in reference to the formation of packaged IC 200 illustrated in method 300 of FIG. 8. In block 104, as discussed above, the bottom die wafer (containing the bottom die) is prepared by backgrinding the bottom die wafer to a desired thickness in block 108 and dicing the bottom die wafer to singulate the die in block 110. The bottom wafer corresponds in which to the wafer containing bottom die 16 of set 202. In block 304, the same discussions provided with respect to block 104 apply to the preparation of bottom wafer #2, which corresponding to the wafer containing bottom die 216 of set 204. In block 304, the bottom die wafer #2 (containing the bottom die of set 204) is prepared by backgrinding the bottom die wafer #2 to a desired thickness in block 308 and dicing the bottom die wafer to singulate die #2 (the bottom die of set 204) in block 310. Note that the wafer prepared in block 104 may also include die 216, in which case both die are obtained from the same wafer and a second wafer need not be prepared in block 304. If the bottom die of each set are on different wafers, the bottom wafer prep and bottom wafer #2 wafer prep are performed separately, and can be performed at different times.

Method 300 begins at start 302 and proceeds to block 334 in which die 16 is attached to lead frame flag section 210 using an epoxy die attach material for adhesive. After attaching die 16 to flag section 210, the assembly is cured. Also in block 334, die 216 is attached to lead frame flag section 212 using an epoxy die attach material for adhesive. After attaching die 216 to flag section 211, the assembly is cured. These die attach materials may be a silicone die attach, a DAF, or the like. The attaching for each set 202 and 204 can be done sequentially or simultaneously. Also, the curing for each set 202 and 204 can be done sequentially or simultaneously.

In block 128, an isolation layer is prepared by mounting the isolation layer onto a die attach film (DAF) in block 130 and then dicing the isolation layer mounted onto the DAF in block 132, to result in a pre-formed isolation layer for set 202. That is, the isolation layer is fully formed prior to attachment to die 16. In block 328, an isolation layer #2 is prepared by mounting the isolation layer #2 onto a DAF in block 332 and then dicing the isolation layer #2 mounted on to the DAF in block 332, to result in a second pre-formed isolation layer for set 204.

Returning to method 300, after block 334, method 300 proceeds to block 336 in which each the pre-formed isolation layer with the DAF is attached to the corresponding bottom die, die 16 or die 216. These can be performed separately. In this embodiment, the pre-formed isolation layer for set 202 is isolation layer 28 and for set 204 is isolation layer 228. Since the isolation layers are pre-formed and mounted on the DAF, the combined thickness of the isolation layer and any adhesive layers for each of set 202 and 204 can be uniform and tightly controlled. If a gel or paste adhesive were used rather than a DAF, the resulting thickness would be less controlled. Afterwards, the assembly of die 16 with isolation layer 28 and the assembly of die 216 with isolation layer 228, with corresponding adhesive layers, are cured in block 338. Again, each assembly can be cured simultaneously or separately.

In block 112, as discussed above, the top die wafer (containing the top die of set 202) is prepared by backgrinding the top die wafer to a desired thickness in block 116, mounting the top die wafer to a DAF in block 120, and dicing the top die wafer with the DAF to singulate the top die (corresponding to die 16) in block 122. In block 312, the top wafer #2 (the wafer containing the top die of set 204) is prepared by backgrinding the top die wafer #2 to a desired thickness in block 316, mounting the top die wafer #2 to a DAC in block 320, and then dicing the top die wafer #2 with the DAF to singulate the top die #2 (corresponding to die 228) in block 322. Blocks 112 and 312 may be performed separately.

Method 300 continues after block 338 to block 340 in which each singulated top die mounted on the DAF is attached to a corresponding isolation barrier (or isolation layer). Similar to the DAF used for isolation layers 28 and 228, the use of a DAF for attaching die 20 to isolation layer 28 and die 220 to isolation layer 228 allows for the resulting thickness of layers between die 16 and die 20 as well as between die 216 and die 220, to be uniform and tightly controlled. In alternate embodiments, other adhesive layers may be used which allow for a controlled thickness. Again, if a gel or paste adhesive were used, the resulting thickness may be less controlled. Note that depending on the type of adhesive used for adhesive layers, the adhesive layer may extend to the edges of isolation layer 28 or isolation layer 228, or beyond. In one embodiment, a combined thickness of isolation layer 28 and the adhesive layers of set 202 or a combined thickness of isolation layer 228 and the adhesive layers of set 204, is between 50 and 500 micrometers, or preferably, in between 50 and 200 micrometers, or preferably, between 90 and 110 micrometers.

After block 340, method 300 proceeds with block 342 in which the assembly having die 16, isolation layer 28, and die 20 is cured to cure adhesive layer 30, and the assembly having did 216, isolation layer 228, and die 220 is cured to also cure its corresponding adhesive layer. In one embodiment, the cures of the assemblies are performed together or they may be cured separately. In an alternate embodiment, the cure of block 338 may not be performed, in which case, only the cure in block 342 would be performed to cure the adhesive layers of the assemblies. After block 342, method 300 proceeds to block 344 in which wire bond connections are formed from the lead frame leads to die 16 and die 20, such as wire bonds 34 and 32, and from the lead frame leads to die 216 and die 220, such as wire bonds 234 and 232. Also, wire bonds between die, such as wire bonds 244 and 246 are formed. Method 300 continues with block 346 in which die 16, isolation layer 28, die 20, die 216, isolation layer 228, die 220, and the wire bonds are encapsulated with encapsulant 336. Any known techniques may be used to form the wire bonds and to encapsulate the die. Additional steps may be performed, such as trimming and forming of leads, to result in substantially completed packaged IC 200. Method 300 ends at end 348.

Note that the off-line preparation blocks, such as blocks 104, 128, 112, 304, 328 and 312 can be performed before beginning method 300. Also, they can be performed in any order. Also, note that although two die are illustrated, any number of die and pre-formed isolation layers may be used, as needed, within each set of stacked die. Furthermore, the pre-formed isolation layer may have various different sizes and shapes, and the size and shape may vary between sets of stacked die. Although the illustrated embodiment is in reference to a lead frame based package, other packages may be used which also include stacked die with intervening pre-formed isolation layers such as layer 28 or 228. For example, an isolation layer such as isolation layer 28 or 228 may be used for ball grid array (BGA) packages with organic or inorganic substrates.

Figure 9:
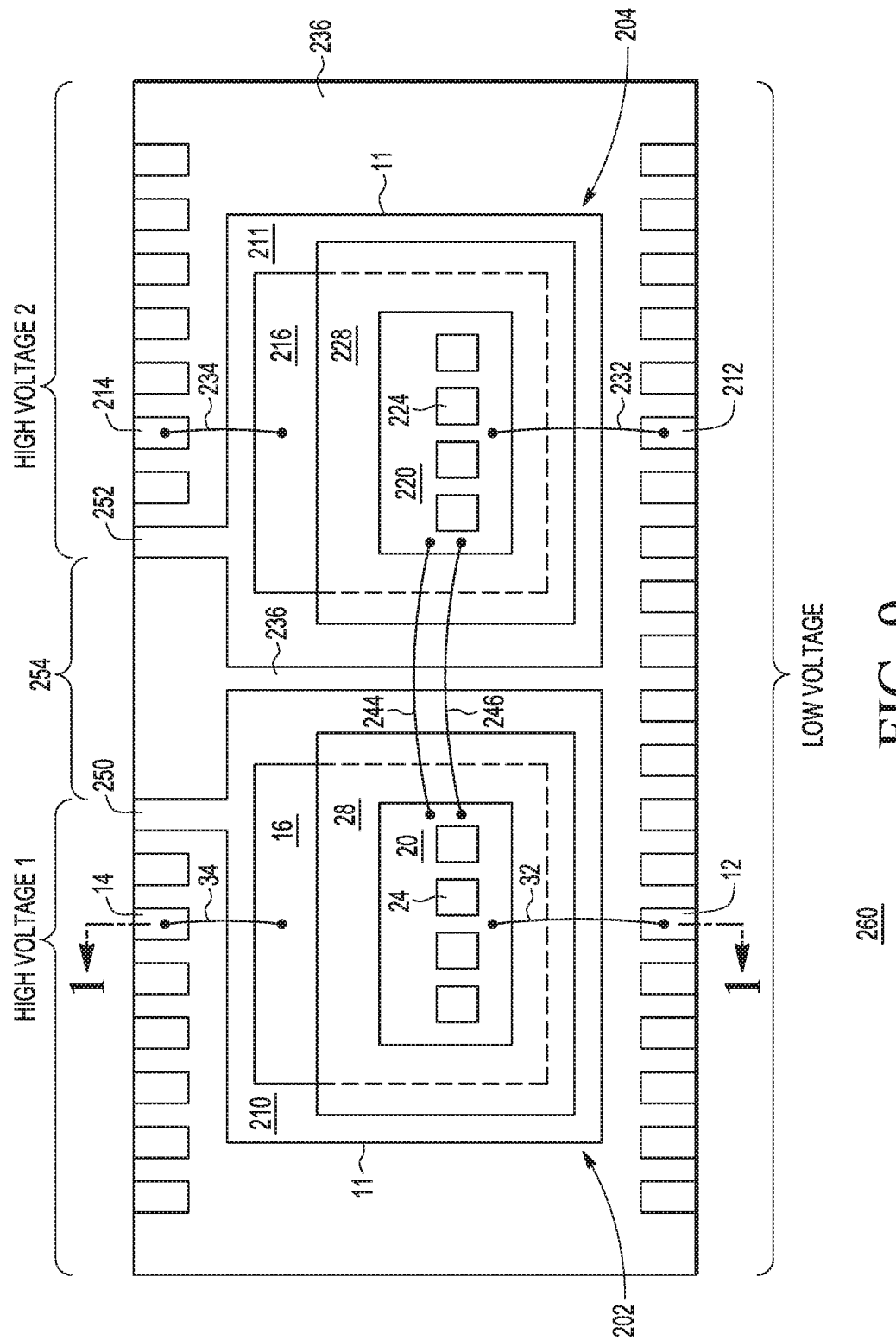
FIG. 9 illustrates a top down view of a packaged IC having multiple sets of stacked die, in accordance with one embodiment of the present invention.

FIG. 9 illustrates a top down view of a singulated packaged IC 260, in accordance with one embodiment of the present invention. Note that like numerals with IC 200 of FIG. 7 indicate like elements. Compared to the lead frame of IC 200, the lead frame of IC 260 has fewer leads between adjacent sets of stacked die, such as in a region 254 of the lead frame. Region 254 is a leadless region (i.e. a region without leads) that is located between a lead coupled to set 202 (e.g. lead 250) and a lead coupled to set 204 (e.g. lead 252). Region 254 has a width that is greater than a pitch of the leads of the lead frame, or, preferably, greater than twice the pitch of the leads. In this embodiment, different leads, such as leads 250 and 252 extend from each lead frame section as compared to leads 240, 248, and 242 of FIG. 7. As discussed above with respect to FIG. 7, leads of the top half of the lead frame may correspond to HV leads in different HV domains. For example, those leads within high voltage 1 are coupled to a HV die such as die 16 and those leads within high voltage 2 are coupled to a HV die such as die 216. The leads on the bottom half of the lead frame may correspond to LV leads which are coupled to LV die such as die 20 and 220.

In FIG. 9, having region 254, which includes no leads between leads 250 and 252 of adjacent sets of stacked die, increases the external creepage distance of packaged IC 260 between HV leads, as compared to the creepage distance of packaged IC 200. The external creepage distance is the shortest distance between a pair of conductors (such as two leads at different electrical potentials) along a surface of solid insulation material (such as a package body). Therefore, in one example, this external creepage distance refers to the distance along encapsulant 236, between HV leads 250 and 252 adjacent. This allows for better isolation between the HV domains. Therefore, in one embodiment, regions 254 has a width wide enough to meet a minimum creepage distance requirement.

In the illustrated embodiment of FIG. 9, the lead frame of packaged IC 260 is rectangular in shape, but alternatively, may have a different aspect ratio and be shaped, for example, more like a square, depending on the needs and shapes of sets 202 and 204, or any other set located in packaged IC 260. That is, although two sets of stacked die are illustrated, packaged IC 260 may include more sets of similarly stacked die and may include any number of wire bonds, similar to wire bonds 244 and 246, among the multiple sets. Furthermore, if greater than two sets of stacked die are included in packaged IC 260, the bottom die of the sets can operate in two or more higher voltage domains.

Therefore, by now it can be appreciated that a package with multiple sets of stacked die is provided which provides galvanic isolation between the die of the die stacks to allow for effective communication between inductors of each die. A pre-formed isolation layer is used to provide isolation between adjacent stacked die of each set of stacked die. The thickness of the pre-formed isolation layer, in combination with the thicknesses of adhesive layers used between the isolation layer and each of the adjacent die, can be tightly controlled to allow the inductors to remain in close proximity. Also, the pre-formed isolation layer extends beyond an edge of the top die of each set of stacked die to protect the isolation layer from damage caused by arcing electrical fields between the stacked die of each set. Furthermore, by having a region in which leads are lacking in between adjacent sets of stacked die, increased creepage distance may also be achieved.

It should also be appreciated that any IC die referenced herein may refer to any of a variety of electronic components, including but not limited to a semiconductor device, a passive device, such as a relay, a resistor, an inductor, a capacitor, a diode, a power transistor, an oscillator, and the like, or other types of electronic devices.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different packaging technologies may be used other than lead frames, and different adhesive layers may be used other than DAFs. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a packaged integrated circuit (IC) device includes a first set of stacked die including a first IC die, a first inductor in the first IC die, an isolation layer over the first IC die, a second IC die over the isolation layer, and a second inductor in the second IC die aligned to communicate with the first inductor, wherein the isolation layer extends a prespecified distance beyond a first edge of the second IC die; and a second set of stacked die including a third IC die, a third inductor in the third IC die, a second isolation layer over the third IC die, a fourth IC die over the second isolation layer, and a fourth inductor in the fourth IC die aligned to communicate with the third inductor, wherein the second isolation layer extends a second prespecified distance beyond a first edge of the fourth IC die. In one aspect of the one embodiment, the packaged IC device further includes a lead frame flag having a first section and a second section, wherein the first die is attached to the first section and the third die is attached to the second section, wherein the first and second section are physically separate from each other. In a further aspect, the packaged IC device further includes an encapsulant over and surrounding the first set of stacked die and the second set of stack die, and between the first and second sections of the lead frame flag. In another aspect, the first set includes a first adhesive layer between the first IC die and the isolation layer and a second adhesive layer between the isolation layer and the second IC die, and the second set includes a third adhesive layer between the third IC die and the second isolation layer and a fourth adhesive layer between the second isolation layer and the fourth IC die. In a further aspect, the isolation layer includes a first material that is one of a group consisting of a dielectric, epoxy, bismaleimide triazine (BT), FR-4, a resin, and a polyimide material, and the second isolation layer includes a second material that is one of a group consisting of a dielectric, epoxy, bismaleimide triazine (BT), FR-4, a resin, and a polyimide material. In another aspect, a first creepage distance between the first edge of the second IC die and a first edge of the insulator layer is at least 100 micrometers, and a second creepage distance between the first edge of the fourth IC die and a first edge of the second insulator layer is at least 100 micrometers. In yet another aspect, the first IC die and the third IC die are coupled to receive high voltage signals as compared to voltage signals received by the second and fourth IC die. In a further aspect, each lead along a top edge of the packaged IC device is coupled to the first IC die or the third IC die. In an even further aspect, the packaged IC device further includes wire bonds to connect each lead of a first plurality of leads along the top edge of the packaged IC device to the first IC die or the third IC die; and at least one wire bond connected between the second IC die and the fourth IC die. In yet an even further aspect, each lead along a bottom edge, opposite the top edge, of the packaged IC device is coupled to the second IC die or the fourth IC device, and the packaged IC device further includes wire bonds to connect each lead of a second plurality of leads along the bottom edge of the packaged IC device to the second IC die or the fourth IC die. In another further aspect, the first IC die and third IC die are in separate high voltage domains, and the second IC die and the fourth IC die are in a separate low voltage domain, wherein each of the high voltage domains operate at higher voltages than the low voltage domain. In another further aspect, the packaged IC device further includes a leadless region between a first lead coupled to the first set of stacked die and a second lead coupled to the second set of stacked die, wherein the leadless region has a width greater than at least one pitch of leads adjacent one side of the leadless region. In another aspect of the one embodiment, the first set of stacked die further comprises a conductive ring between isolation layer and the second IC die, the conducive ring extending past the first edge of the second IC die, wherein the first edge is perpendicular to the isolation layer.

In another embodiment, a method of making a packaged integrated circuit (IC) device includes attaching a bottom side of a first IC die to a first flag section of a lead frame, wherein the first IC die includes a first inductor; attaching a first isolation barrier to a top side of the first IC die; attaching a second IC die to a top side of the first isolation barrier, wherein the second IC die includes a second inductor positioned to communicate signals to and from the first inductor, and the first isolation barrier extends beyond a first edge of the second die a first distance; attaching a bottom side of a third IC die to a second flag section of the lead frame, wherein the first and second flag sections are physically and electrically separate from each other, wherein the third IC die includes a third inductor; attaching a second isolation barrier to a top side of the third IC die; attaching a fourth IC die to a top side of the second isolation barrier, wherein the fourth IC die includes a fourth inductor positioned to communicate signals to and from the third inductor, and the second isolation barrier extends beyond a first edge of the fourth die a second distance; and forming an encapsulation which covers the first, second, third, and fourth IC die, and is formed between the first and second flag sections of the lead frame. In one aspect of the another embodiment, the method further includes forming wire bonds between contacts on the first IC die and a first set of lead fingers; forming wire bonds between contacts on the third IC die and a second set of lead fingers; forming wire bonds between contacts on the second IC die and a third set of lead fingers; forming wire bonds between contacts on the fourth IC die and a fourth set of lead fingers; and forming wire bonds between contacts on the second IC die and the fourth IC die, wherein the encapsulation further encapsulates all wire bonds. In a further aspect, the first and second set of lead fingers are located along a top edge of the packaged IC device, and the third and fourth set of lead fingers are located along a bottom edge of the packaged IC device, wherein the first and second set of lead fingers receive high voltage signals as compared to the third and fourth set of lead fingers. In yet a further aspect, the first IC die and third IC die are in separate high voltage domains, and the second IC die and the fourth IC die are in a separate low voltage domain, wherein each of the high voltage domains operate at higher voltages than the low voltage domain. In yet an even further aspect, the lead frame comprises a leadless region between a first lead finger coupled to the first IC die and a second lead finger coupled to the third IC die, wherein the leadless region has a width greater than at least one pitch of leads adjacent one side of the leadless region. In another aspect of the another embodiment, the first distance is such that a creepage distance corresponding to the first IC die, the first isolation barrier, and the second IC die is at least 100 micrometers, and the second distance is such that a creepage distance corresponding to the third IC die, the second isolation barrier, and fourth IC die is at least 100 micrometers. In another aspect, the method further includes forming a first conductive ring on the top side of the first isolation barrier prior to attaching the second IC die to the top side of the first isolation barrier, wherein an outer perimeter of the first conductive ring is outside a perimeter of the second IC die; forming a second conductive ring on the top side of the second isolation barrier prior to attaching the fourth IC die to the top side of the second isolation barrier, wherein an outer perimeter of the second conductive ring is outside a perimeter of the fourth IC die.

What is claimed is:

1. A packaged integrated circuit (IC) device comprising:
  a first set of stacked dies including:
   a first IC die,
   a first inductor in the first IC die,
   an isolation layer over the first IC die,
   a second IC die over the isolation layer, and
   a second inductor in the second IC die aligned to communicate with the first inductor, wherein the isolation layer extends a prespecified distance beyond a first edge of the second IC die; and
  a second set of stacked dies including:
   a third IC die,
   a third inductor in the third IC die,
   a second isolation layer over the third IC die,
   a fourth IC die over the second isolation layer, and
   a fourth inductor in the fourth IC die aligned to communicate with the third inductor, wherein the second isolation layer extends a second prespecified distance beyond a first edge of the fourth IC die;
  wherein the first IC die and the third IC die are coupled to receive high voltage signals as compared to voltage signals received by the second and fourth IC die, and wherein the packaged IC device further comprises at least one wire bond connected between the second IC die and the fourth IC die.

2. The packaged IC device of claim 1, further comprising:
  a lead frame flag having a first section and a second section, wherein the first die is attached to the first section and the third die is attached to the second section, wherein the first and second section are physically separate from each other.

3. The packaged IC device of claim 2, further comprising:
  an encapsulant over and surrounding the first set of stacked dies and the second set of stack dies, and between the first and second sections of the lead frame flag.

4. The packaged IC device of claim 1, wherein:
  the first set includes a first adhesive layer between the first IC die and the isolation layer and a second adhesive layer between the isolation layer and the second IC die, and
  the second set includes a third adhesive layer between the third IC die and the second isolation layer and a fourth adhesive layer between the second isolation layer and the fourth IC die.

5. The packaged IC device of claim 4, wherein the isolation layer includes a first material that is one of a group consisting of a dielectric, epoxy, bismaleimide triazine (BT), FR-4, a resin, and a polyimide material, and the second isolation layer includes a second material that is one of a group consisting of a dielectric, epoxy, bismaleimide triazine (BT), FR-4, a resin, and a polyimide material.

6. The packaged IC device of claim 1, wherein:
  a first creepage distance between the first edge of the second IC die and a first edge of the insulator layer is at least 100 micrometers, and
  a second creepage distance between the first edge of the fourth IC die and a first edge of the second insulator layer is at least 100 micrometers.

7. The packaged IC device of claim 1, wherein each lead of a first plurality of leads along a top edge of the packaged IC device is coupled to the first IC die or the third IC die.

8. The packaged IC device of claim 7, further comprising:
  wire bonds to connect each lead of the first plurality of leads along the top edge of the packaged IC device to the first IC die or the third IC die.

9. The packaged IC device of claim 8, wherein each lead along a bottom edge, opposite the top edge, of the packaged IC device is coupled to the second IC die or the fourth IC device, and further comprising:
  wire bonds to connect each lead of a second plurality of leads along the bottom edge of the packaged IC device to the second IC die or the fourth IC die.

10. The packaged IC device of claim 1, further comprising a leadless region between a first lead coupled to the first set of stacked dies and a second lead coupled to the second set of stacked dies, wherein the leadless region has a width greater than at least one pitch of leads adjacent one side of the leadless region.

11. A packaged integrated circuit (IC) device comprising:
  a first set of stacked dies including:
    a first IC die,
    a first inductor in the first IC die,
    an isolation layer over the first IC die,
    a second IC die over the isolation layer, and
    a second inductor in the second IC die aligned to communicate with the first inductor, wherein the isolation layer extends a prespecified distance beyond a first edge of the second IC die; and
  a second set of stacked dies including:
    a third IC die,
    a third inductor in the third IC die,
    a second isolation layer over the third IC die,
    a fourth IC die over the second isolation layer, and
    a fourth inductor in the fourth IC die aligned to communicate with the third inductor, wherein the second isolation layer extends a second prespecified distance beyond a first edge of the fourth IC die,
  wherein the first IC die and third IC die are in separate high voltage domains, and the second IC die and the fourth IC die are in a separate low voltage domain, wherein each of the high voltage domains operate at higher voltages than the low voltage domain.

12. The packaged IC device of claim 11, further comprising:
  a lead frame flag having a first section and a second section, wherein the first die is attached to the first section and the third die is attached to the second section, wherein the first and second section are physically separate from each other.

13. The packaged IC device of claim 12, further comprising:
  an encapsulant over and surrounding the first set of stacked die and the second set of stack die, and between the first and second sections of the lead frame flag.

14. The packaged IC device of claim 11, wherein:
  the first set includes a first adhesive layer between the first IC die and the isolation layer and a second adhesive layer between the isolation layer and the second IC die, and
  the second set includes a third adhesive layer between the third IC die and the second isolation layer and a fourth adhesive layer between the second isolation layer and the fourth IC die.

15. The packaged IC device of claim 14, wherein the isolation layer includes a first material that is one of a group consisting of a dielectric, epoxy, bismaleimide triazine (BT), FR-4, a resin, and a polyimide material, and the second isolation layer includes a second material that is one of a group consisting of a dielectric, epoxy, bismaleimide triazine (BT), FR-4, a resin, and a polyimide material.

16. The packaged IC device of claim 11, wherein:
  a first creepage distance between the first edge of the second IC die and a first edge of the insulator layer is at least 100 micrometers, and
  a second creepage distance between the first edge of the fourth IC die and a first edge of the second insulator layer is at least 100 micrometers.

17. The packaged IC device of claim 11, wherein the first IC die and the third IC die are coupled to receive high voltage signals as compared to voltage signals received by the second and fourth IC die.

18. The packaged IC device of claim 17, wherein each lead along a top edge of the packaged IC device is coupled to the first IC die or the third IC die.

19. The packaged IC device of claim 17, further comprising a leadless region between a first lead coupled to the first set of stacked die and a second lead coupled to the second set of stacked die, wherein the leadless region has a width greater than at least one pitch of leads adjacent one side of the leadless region.

20. A packaged integrated circuit (IC) device comprising:
  a first set of stacked die including:
    a first IC die,
    a first inductor in the first IC die,
    an isolation layer over the first IC die,
    a second IC die over the isolation layer,
    a second inductor in the second IC die aligned to communicate with the first inductor, wherein the isolation layer extends a prespecified distance beyond a first edge of the second IC die, and
    a conductive ring between isolation layer and the second IC die, the conducive ring extending past the first edge of the second IC die, wherein the first edge is perpendicular to the isolation layer; and
  a second set of stacked die including:
    a third IC die,
    a third inductor in the third IC die,
    a second isolation layer over the third IC die,
    a fourth IC die over the second isolation layer, and
    a fourth inductor in the fourth IC die aligned to communicate with the third inductor, wherein the second isolation layer extends a second prespecified distance beyond a first edge of the fourth IC die.

* * * * *